US012666731B2

(12) United States Patent
Huang et al.

(10) Patent No.: US 12,666,731 B2
(45) Date of Patent: Jun. 23, 2026

(54) SIMULTANEOUS DUAL-BAND SYSTEMS AND METHODS

(71) Applicant: Attollo Engineering, LLC, Camarillo, CA (US)

(72) Inventors: Edward K. Huang, Newbury Park, CA (US); Andrew D. Hood, Ventura, CA (US)

(73) Assignee: Attollo Engineering, LLC, Camarillo, CA (US)

( * ) Notice: Subject to any disclaimer, the term of this patent is extended or adjusted under 35 U.S.C. 154(b) by 399 days.

(21) Appl. No.: 18/244,100

(22) Filed: Sep. 8, 2023

(65) Prior Publication Data

US 2024/0088194 A1 Mar. 14, 2024

Related U.S. Application Data

(60) Provisional application No. 63/405,146, filed on Sep. 9, 2022.

(51) Int. Cl.
H10F 39/18 (2025.01)
H10F 39/00 (2025.01)
(52) U.S. Cl.
CPC ....... H10F 39/1825 (2025.01); H10F 39/011 (2025.01); *H10F 39/809* (2025.01)
(58) Field of Classification Search
CPC ... H10F 39/1825; H10F 39/011; H10F 39/809
See application file for complete search history.

(56) References Cited

U.S. PATENT DOCUMENTS

| | | | |
|---|---|---|---|
| 9,146,157 B1 * | 9/2015 | Rajavel | H10F 39/1847 |
| 11,282,887 B2 | 3/2022 | Nguyen et al. | |
| 2018/0019269 A1 | 1/2018 | Klipstein | |
| 2018/0294376 A1 | 10/2018 | Tian et al. | |
| 2019/0245009 A1 * | 8/2019 | Lee | H10K 19/201 |
| 2021/0075985 A1 * | 3/2021 | Lee | G06V 10/147 |
| 2021/0225941 A1 | 7/2021 | Huang | |

OTHER PUBLICATIONS

IP.COM-1 search attached (Year: 2026).*
IP.COM-2 search attached (Year: 2026).*
"Internamational Search Report and Written Opinion For Application PCT/US2023/032330 Mailed on Dec. 27, 2023", 10 pages.

* cited by examiner

*Primary Examiner* — Zandra V Smith
*Assistant Examiner* — Andre c Stevenson
(74) *Attorney, Agent, or Firm* — Billion & Armitage

(57) ABSTRACT

The present disclosure is directed generally to simultaneous dual-band systems and methods. A dual-band system as disclosed herein includes a plurality of pixels. Each pixel comprising a first absorber layer; a first intervening layer located adjacent the first absorber layer; a second absorber layer located adjacent to the first intervening layer; and a second intervening layer located adjacent to the second absorber layer. The plurality of pixels includes a first subset of pixels for detecting light in a first band and a second subset of pixels for detecting light in a second band. Carriers created in the first absorber layer of the first subset of pixels are collected via the first contact layer. Carriers created in the second absorber layer of the second subset of pixels are collected via the second contact layer and carriers created in the first absorber layer remain uncollected.

20 Claims, 5 Drawing Sheets first etch mask data  504 deep etch mask data  506

SIMULTANEOUS DUAL-BAND SYSTEMS AND METHODS

CROSS-REFERENCE TO RELATED APPLICATIONS

This application claims benefit of and priority to U.S. Provisional Application No. 63/405,146, titled "SIMULTANEOUS DUAL-BAND SYSTEMS AND METHODS", filed Sep. 9, 2022, the contents of which are incorporated by reference herein.

BACKGROUND

A dual-band photodetector or imager is a device that detects or responds to incident light by using the photoelectric effect of absorbed individual photons. Photodetectors may be designed to detect incident light within a particular spectral frequency range (e.g., visible, infrared, etc.). A dual-band photodetector is one that is capable of operating in a first mode to detect light in a first spectral range and a second mode to detect light in a second spectral range.

Generally, dual-band photodetectors are temporally interleaved. That is, operation in the first mode is interleaved with operation in the second mode by selectively switching modes On and Off. The temporal interleaving of each band, however, presents a time lag where spatial correlation of objects can be lost, especially for fast moving objects.

SUMMARY

According to one aspect, a dual-band imaging device includes a plurality of pixels. Each pixel comprising a first absorber layer; a first intervening layer located adjacent the first absorber layer; a second absorber layer located adjacent to the first intervening layer; and a second intervening layer located adjacent to the second absorber layer. The plurality of pixels includes a first subset of pixels for detecting light in a first band and a second subset of pixels for detecting light in a second band. The first subset of pixels comprising: a first ground plane contact in contact with the first absorber layer; and a first contact layer in contact with the second absorber layer, wherein carriers created in the first absorber layer are collected via the first contact layer. The second subset of pixels comprising: a second ground plane contact in contact with the second absorber layer; and a second contact layer in contact with the second intervening layer, wherein carriers created in the second absorber layer are collected via the second contact layer and carriers created in the first absorber layer remain uncollected.

According to another aspect, a dual-band image device comprising: a first pixel and a second pixel. The first pixel comprised of: a first absorber layer, a second absorber layer, a first intervening layer located between the first and second absorber layers, a second intervening layer located on top of the second absorber layer, a first ground contact in electrical contact with the first absorber layer, and a first upper contact in electrical contact with the second absorber layer, The first pixel collects carriers created in the first absorber layer using a first diode detector comprising the first absorber layer, the first intervening layer, and the second absorber layer. The second pixel comprised of: the first absorber layer, the second absorber layer, the first intervening layer located between the first and second absorber layers, the second intervening layer located on top of the second absorber layer, a second ground contact in electrical contact with the second absorber layer, and a second upper contact in electrical contact with the second intervening layer. The second pixel collects carriers created in the second absorber layer using a second diode detector comprising the second absorber layer and the second intervening layer.

DETAILED DESCRIPTION

The present invention is directed generally to simultaneous dual-band systems and methods. A dual-band system as disclosed herein simultaneously detects light in a first band (i.e., first frequency range of light) and a second band (i.e., second frequency range of light). In other words, the dual-band system can read out multiple bands at a single point in time and on the same focal plane array. This means that there is no time lag where spatial correlation of objects can be lost, especially for fast moving objects. An attribute of the architecture of the dual-band system is that it includes sequential diodes with the same polarity, e.g., p on n or n on p. Another advantage of a dual-band system disclosed herein is that it may be used with commercially available single polarity read-out integrated circuits (ROICs), where the single polarity refers to the bias voltage applied to collect carriers by the ROIC.

Figure 1:
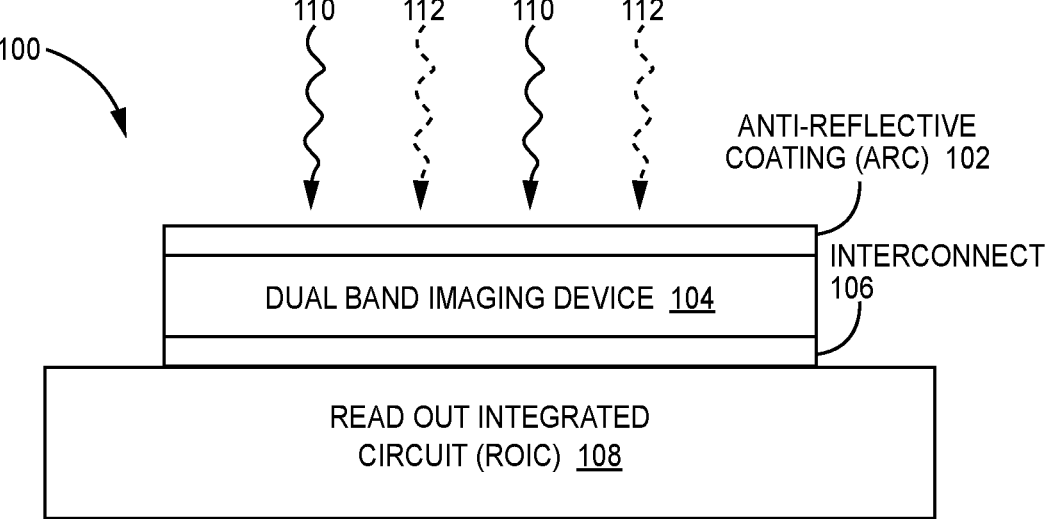
FIG. 1 is a block diagram of a dual-band imaging system according to some embodiments.

Referring now to FIG. 1, a block diagram of a dual-band imaging system 100 is provided that includes an anti-reflective coating 102, an imaging device 104, an interconnect 106, and a read-out integrated circuit (ROIC) 108. Light 110, 112 incident on the dual-band imaging system 100 passes through the anti-reflective coating 102 and is detected by one of a plurality of absorption layers (described in more detail in FIGS. 2 and 3) located within the imaging device 104. In particular, the imagine device 104 comprises of a first plurality of pixels configured to detect light 110 within a first band (e.g., first frequency range) and a second plurality of pixels configured to detect light 112 within a second band (e.g., second frequency range). Light is detected by converting the incident light to an electrical response (e.g., electrical carrier) and collecting the electrical response via the interconnect 106 and stored as electrical charge on the ROIC 108.

More particularly, the ROIC 108 is in electrical communication with each of the first plurality of pixels and second plurality of pixels associated with the imaging device 104. The ROIC 108 provides a bias voltage to each of the plurality of pixels that allows electrical carrier (e.g., electrons, holes) generated as a result of absorption of incident light to be collected and measured by the ROIC 108. In some embodiments, ROIC 108 is a single polarity read out integrated circuit, meaning that the bias voltage applied to each of the plurality of pixels is of the same polarity. That is, the bias voltage applied to each of the first plurality of pixels utilized to detect incident light 110 in a first band has the same polarity as the bias voltage applied to each of the second plurality of pixels utilized to detect incident light 112 in a second band. As described in more detail below, the architecture of the first and second plurality of pixels in the dual-band imaging device 104 allows for the ROIC 108 to simultaneously read-out or collect carriers from the first and second plurality of pixels. That is, the ROIC 108 is not required to temporally interleave the read-out from the first plurality of pixels with read-out from the second plurality of pixels.

In some embodiments, the ROIC 108 is electrically coupled to the dual-band imaging device 104 via the interconnect 106. However, in other embodiments, the ROIC 108 may include a plurality of electrical bumps in direct electrical contact with the dual-band imaging device 104 (i.e., without the presence of interconnect 106). In still other embodiments, the ROIC 108 may be designed as part of or integrated with the imaging device 104, in which no separate interconnect 106 is required. Likewise, with respect to the anti-reflective coating 102, any suitable anti-reflective coating may be utilized including in some embodiments in which no anti-reflective coating 102 is required.

In some embodiments, the ROIC 108 a single-color ROIC (i.e., a ROIC designed for use with a single band imaging device). A typical single-color ROIC provides a single bias voltage between a ground contact (not shown) and a contact associated with each of the plurality of pixels configured to detect a particular band. In some embodiments, ROIC 108 may be a single-color ROIC, but requires an additional ground contact (i.e., a second ground contact in addition to the typical single ground contact) for use with the dual-band imaging device 104. In some embodiments, the additional ground contact may include an external ground contact routed to the dual-band imaging device 104 (not shown).

Figure 2:
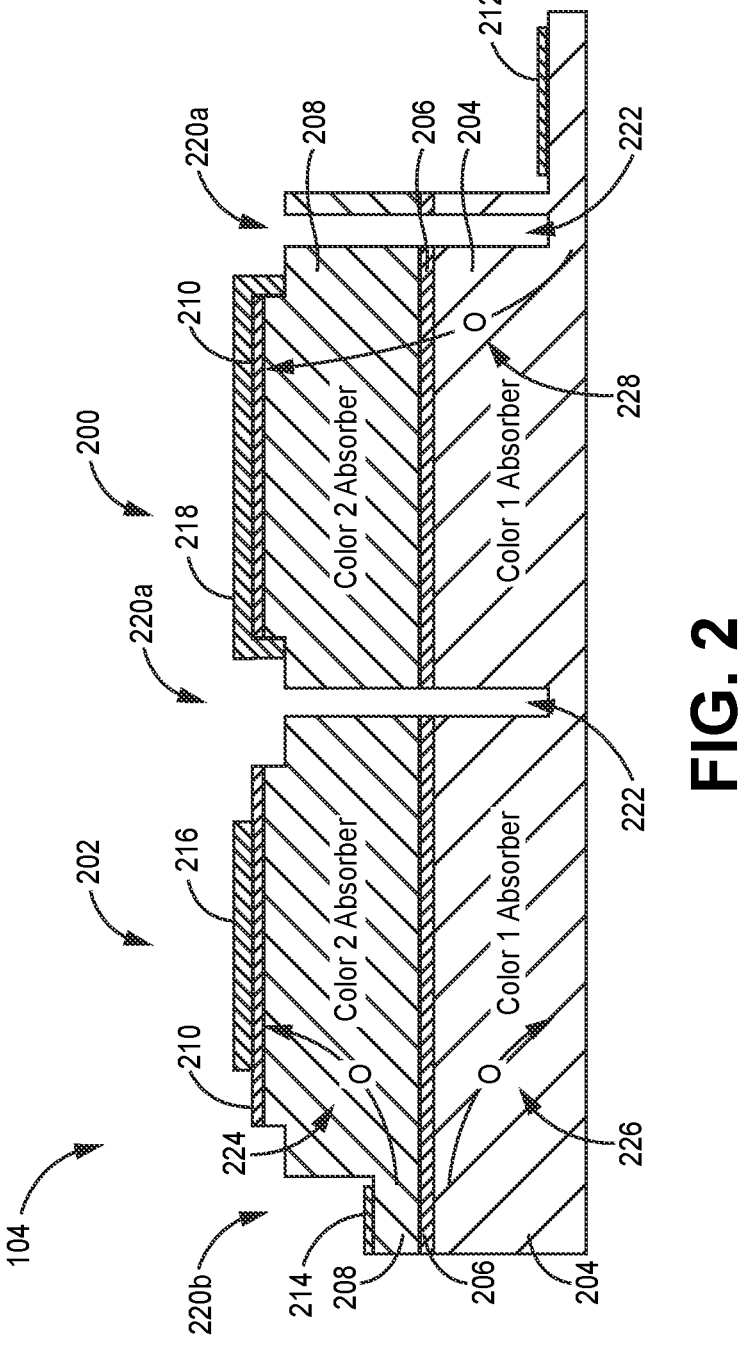
FIG. 2 is a cross-sectional view illustrating the architecture of first pixels and second pixels according to some embodiments.

FIG. 2 is a cross-sectional view of a first pixel 200 and a second pixel 202 included as part of the dual-band imaging device 104 according to some embodiments. The first pixel 200 is configured to detect light 110 in a first band and the second pixel 202 is configured to detect light 112 in a second band. In some embodiments, a number of layers are shared between the first pixel 200 and the second pixel 202. For example, the first pixel 200 includes a first absorber layer 204, a first intervening layer 206, a second absorber layer 208, a second intervening layer 210, a ground contact layer 212, and a first upper contact layer 218. The second pixel 202 shares with the first pixel 200 the first absorber layer 204, the first intervening layer 206, the second absorber layer 208, and the second intervening layer 210. In addition, the second pixel 202 includes an upper contact 216 and a second ground contact 214. That is, the first pixel 200 includes a first ground contact 212 in contact with the first absorber layer 204 and a first upper contact layer 218 that is electrically connected to both the second intervening layer 210 and the second absorber layer 208. In contrast, the second pixel 202 includes a ground contact (i.e., second ground contact 214) that is in contact with the second absorber layer 208 and an upper contact 216 that is NOT in contact with the second absorber layer 208, but rather only in contact with the second intervening layer 210. In addition, a deep etch or trench 222 separates the first pixel 200 from the second pixel 202. In some embodiments, the deep etch or trench 222 extends from the upper contact layers 216, 218 into the first absorber layer 204.

The ground contact layers 212 and 214 as well as the upper contact layers 216 and 218 are conductors. In some embodiments, the first and second upper contact layers 216 and 218 are in contact with the ROIC 108 via interconnects 106 (shown in FIG. 1). In some embodiments, the ground contact layers 212 and 214 are also in contact with the ROIC 108 via interconnects 106. As discussed above, in some embodiments a single-color ROIC may be utilized and may be configured to provide a first ground contact (connected to either the first ground contact 212 or the second ground contact 214). In this case, an additional external ground contact may be required between the single-color ROIC and either the first ground contact 212 or the second ground contact 214.

The other layers, including the first absorber layer 204, the first intervening layer 206, the second absorber layer 208 and second intervening layer 210 are semiconductor layers. As described in more detail below, the semiconductor layers are p-type or n-type layers, configured to provide p-n junctions for photodetection. In some embodiments, the first absorber layer 204 generates an electrical response (e.g., generation of electrons/holes) by absorbing/converting incident light within a first band (i.e., first range of frequencies). The second absorber layer 208 generates an electrical response by absorbing/converting incident light within a second band (i.e., second range of frequencies). The first pixel 200 is configured to collect/detect light absorbed within the first absorber layer 204 while the second pixel 202 is configured to collect/detect light absorbed within the second absorber layer 208. However, both the first pixel 200 and the second pixel 202 will absorb incident light in both frequency bands. The first pixel 200 is configured to only collect minority carriers 228 generated by incident light absorbed by the first absorber layer 204. Likewise, the second pixel 202 is configured to only collect minority carriers 224 generated by incident light absorbed by the second absorber layer 208. In some embodiments, the first and second intervening layers 206, 210 are semiconductor layer that limit the flow of majority carriers from the respective first and second absorber layers 204,208, and can be composed of wide-gap semiconductors, narrow-gap semiconductor, or combinations thereof. In addition, in order to utilize a single-polarity ROIC, both the first pixel 200 (i.e., first ground contact 212 and first upper contact 218) are biased in the same direction or polarity as the second pixel (i.e., second ground contact 214 and second upper contact 216).

In the embodiment shown in FIG. 2, single polarity read-out is provided by utilizing sequential diodes (i.e., photodetectors or photodiodes) for detection. In general, a photodetector or photodiode is comprised of a reverse biased p-n junction, wherein light incident on the junction generates minority carriers that are collected at one of the contacts. In the embodiment shown in FIG. 2, the first pixel 200 is configured to collect minority carriers 228 generated in the first absorber layer 204 and the second pixel 202 is configured to collect minority carriers 224 generated in the second absorber layer 208. To this end, the first pixel 200 utilizes the first absorber layer 204, the first intervening layer 206, and the second absorber layer 208 to form a lower diode that is reverse biased based on the bias applied to the first ground contact 212 and the first upper contact 218. The respective layers making up the lower diode may be doped in a variety of ways. For example, the first absorber layer 204 may be an n-type semiconductor layer, the first intervening layer 206 may be a p-type semiconductor layer, and the second absorber layer may be an n-type semiconductor layer (referred to as an N-P-N configuration). In other embodiments, a P-N-P configuration is utilized. In still other embodiments, the first intervening layer 206 is neither p-type nor n-type, but instead is a barrier layer (b). For example, the lower diode may utilize a P-B-P configuration, or a N-B-N configuration. Likewise, with respect to the second pixel 202, the second absorber layer 208 and the second intervening layer 210 form an upper diode that is reverse biased based on the bias applied to the second ground contact 214 and the second upper contact 216. The respective layers making up the upper diode may be doped in a variety of ways as well, although consistent with the doping of the corresponding layers making up the first pixel 200. For example, the second absorber layer 208 may be an n-type semiconductor layer and the second intervening layer 210 may be a p-type semiconductor layer (N-P configuration). In other embodiments, a P-N configuration may be utilized. In still other embodiments (shown in FIG. 3), the second intervening layer 210 may include both a p-type layer and a barrier layer (b), allowing for NB-P or PB-N configurations. Various configurations of the layers are shown in Table 1 provided below.

TABLE 1

| UPPER DIODE | | | |
| --- | --- | --- | --- |
| | LOWER DIODE | | |
| 2nd Intervening Layer 210 | 2nd Absorber Layer 208 | 1st Intervening Layer 206 | 1st Absorber Layer 204 |
| P | N | P | N |
| N | P | N | P |
| 2nd Intervening Layer 310 | 2nd Absorber Layer 308 | 1st Intervening Layer 306 | 1st Absorber Layer 304 |
| PB | N | B | N |
| NB | P | B | P |

In some embodiments, the bias applied between the first ground contact 212 and the first upper contact 218 is selected to reverse bias the junction associated with the first absorber layer 204 and the first intervening layer 206 associated with the first pixel 200. As a result of the applied bias, minority carriers 228 generated in the first absorber layer 204 as a result of incident light in the first band move through the first intervening layer 206 and second absorber layer 208 and are collected by the first upper contact layer 218. In this way, incident light within the first band is detected at the upper contact layer 218 associated with the first pixel 200. In addition, by forming the first upper level contact 218 to be in electrical contact with the second absorber layer 208 (thereby shorting the second intervening layer 210 and the second absorber layer 208 together), minority carriers generated in the second absorber layer 208 are not collected by the first pixel 200. In addition, the biasing of the second pixel—in particular the bias voltage applied between second ground contact 214 and second upper contact layer 216—prevents minority carriers 226 generated in the first absorber layer 204 associated with the second pixel 202 from propagating toward the second upper contact layer 216. As a result, even though incident light within the first band creates minority carriers 226 in the first absorber layer 204 of the second pixel 202, these minority carriers 226 are not allowed to propagate to the second upper contact layer 216 and therefore are not collected or measured. Likewise, the bias applied between the second ground contact 214 and the second upper contact 216 is selected to reverse bias the junction associated with the second absorber layer 208 and the second intervening layer 210 in the second pixel 202. In this way, minority carriers 224 generated in the second absorber layer 208 of the second pixel 202 as a result of incident light in the second band move from the second absorber layer 208 through the second intervening layer 210 for collection by the first upper contact layer 216. In some embodiments, the bias relationship between the first ground contact 212 and the second ground contact 214 is selected to ensure that the lower diode (comprised of first absorber layer 204, the first intervening layer 206, and the second absorber layer 208) is reverse biased by an electric field created between the respective ground contacts 212, 214.

In some embodiments, the dual-band imaging device 104 is fabricated using microfabrication techniques, including deposition/growth, photolithography, and/or etching. For example, the first absorber layer 204, utilized by both the first pixel 200 and the second pixel 202, may be fabricated at the same step. In some embodiments, the first intervening layer 206, second absorber layer 208 and second intervening layer 210 are also shared by the respective pixels and may be fabricated as part of the same step. The respective layers may be etched to form and isolate the respective pixels 200, 202 from one another and/or to provide a base for a contact. For example, a first mesa etch 220a may extend through the second intervening layer 210 and a portion of the second absorber layer 208. For the first pixel 200, the first mesa etch 220a provides an area for the second upper contact 218 to be placed in contact with both the second intervening layer 210 and the second absorber layer 208, to provide the desired short between the respective layers. In some embodiments, a second mesa etch 220b is formed in the second pixel 202 and extends further into the second absorber layer 208. In some embodiments, the second mesa etch 220b provides a surface in contact with the second absorber layer 208 for placement of the second ground contact layer 214. In some embodiments, the third or deep mesa etch 222 is provided between adjacent pixels 200 and 202 and extends from the top layer (i.e., upper contact layers) into the first absorber layer 204. For example, in some embodiments, each first pixel 200 includes a deep mesa etch 222 isolating the first intervening layer 206 and the second absorber layer 208 from the same layers in adjacent pixels. In at least one embodiment, the deep mesa etch 222 provides an area for the first ground contact 212 to be placed in contact with the first absorber layer 204.

Figure 3:
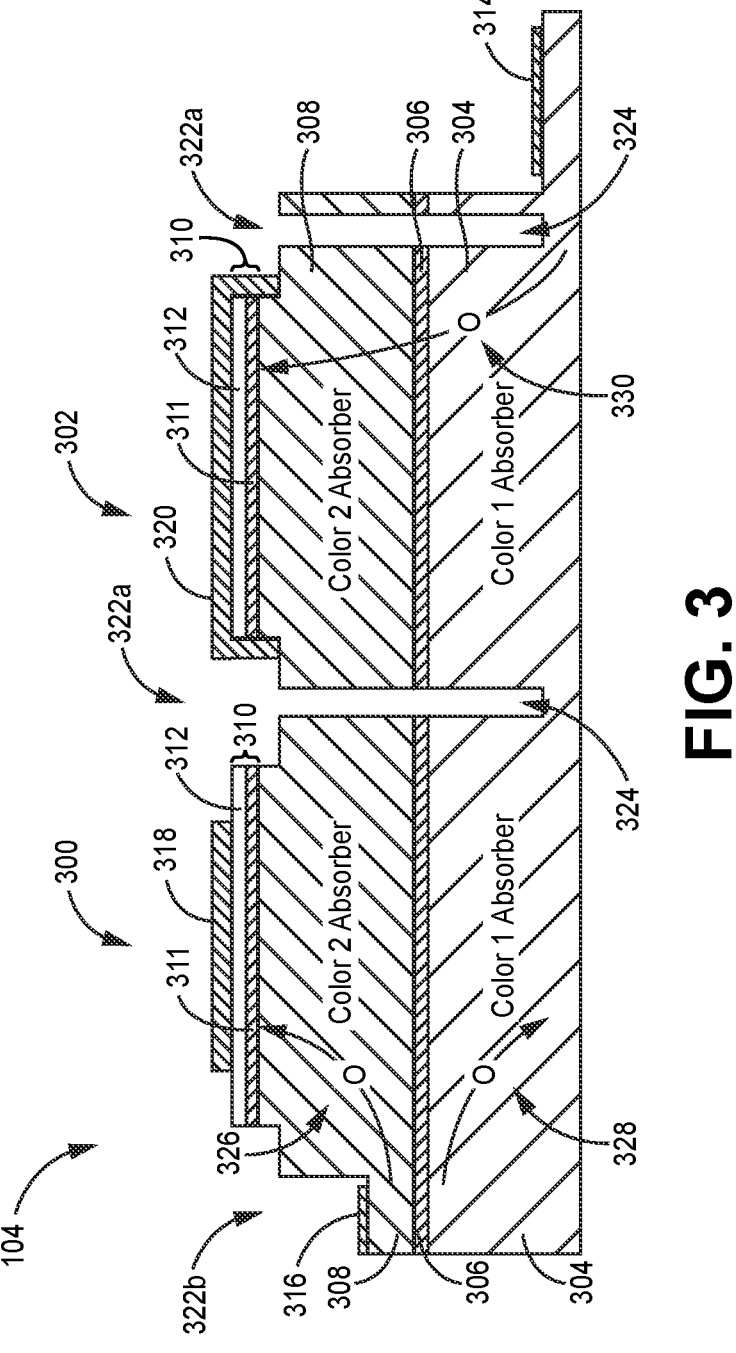
FIG. 3 is a cross-sectional view illustrating the architecture of first pixels and second pixels according to some embodiments.

FIG. 3 is a cross-sectional view of a first pixel 300 and a second pixel 302 included as part of the dual-band imaging device 104' according to some embodiments. Like the dual-band imaging device 104 discussed above, the dual-band imaging device 104' illustrated in FIG. 3 includes a first absorber layer 304, a first intervening layer 306, a second absorber layer 308, a second intervening layer 310, a first ground contact layer 314, a second ground contact layer 316, a first upper contact layer 320, and a second upper contact layer 318. In this embodiment, the first intervening layer 306 is a barrier layer. Additionally, the second intervening layer 310 is comprised of a barrier layer 311 and a semiconductor contact layer 312. In some embodiments, the semiconductor contact layer 312 is a semiconductor layer doped to aid in charge extraction (increase conductivity) associated with each pixel 300, 302. As discussed above, inclusion of the barrier layer 311 allows for N-BP or P-BN configurations. Once again, the first pixel 300 is configured to detect light 110 in a first band and the second pixel 302 is configured to detect light 112 in the second band. In particular, the first pixel 300 is configured to collect minority carriers 330 generated in the first absorber layer 304 and the second pixel 302 is configured to collect minority carriers 326 generated in the second absorber layer 308. With respect to the first pixel 300, the first absorber layer 304, the first barrier layer 306, and the second absorber layer 308 form a lower diode that is reverse biased based on the bias applied to the first ground contact 314 and the first upper contact 320. As a result of the applied bias, minority carriers 330 generated in the first absorber layer 304 as a result of incident light in the first band move through the first intervening (barrier) layer 306 and second absorber layer 308 and are collected by the first upper contact area 320. Similarly, as described with respect to FIG. 2 above, the upper contact area 320 associated with the first pixel 300 is in contact with the intervening layer 310 (including barrier layer 311 and semiconductor contact layer 312) and the second absorber layer 308, to provide the desired short between the respective layers. With respect to the second pixel 302, the bias voltage applied between the second ground contact 316 and second upper contact layer 318 prevent minority carriers 328 generated in the first absorber layer 304 from propagating toward the second upper contact layer 318. In this way, the second pixel 302 does not detect light absorbed by the first absorber layer 304. Likewise, the bias applied between the second ground contact 316 and the second upper contact 318 of the second pixel 302 is selected to reverse bias the junction associated with the second absorber layer 308 and the barrier layer 311 and the semiconductor contact layer 312. In this way, minority carriers 326 generated in the second absorber layer 308 of the second pixel 302 as a result of incident light in the second band move from the second absorber layer 308 through the barrier layer 311 and the semiconductor contact layer 312 for collection by the second upper contact layer 318.

Exemplary Embodiments of a Dual-Band Imaging Device

A first example of a dual-band imaging device 104 comprises a first absorber layer 204 that is an n-type semiconductor, a first intervening layer 206 that is a p-type semiconductor, a second absorber layer 208 that is a n-type semiconductor, and a second intervening layer 210 that is a p-type semiconductor. In this example, the first diode detector is a n-p-n detector and the second diode detector is a p-n detector. The first and second upper contact layers 216, 218 are negatively biased while the first and second ground contact layers 212, 216 are positively biased.

A second example of a dual-band imaging device 104 comprises a first absorber layer 204 that is an p-type semiconductor, a first intervening layer 206 that is a n-type semiconductor, a second absorber layer 208 that is a p-type semiconductor, and a second intervening layer 210 that is a n-type semiconductor. In this example, the first diode detector is a p-n-p detector and the second diode detector is a n-p detector. The first and second upper contact layers 216, 218 are positively biased while the first and second ground contact layers 212, 216 are negatively biased.

A third example of a dual-band imaging device 104' (for example, as shown in FIG. 3) comprises a first absorber layer 304 that is an n-type semiconductor, a first intervening layer 306 that is a first barrier layer, a second absorber layer 308 that is a n-type semiconductor, and a second intervening layer with a second barrier layer 311 and a p-type semiconductor 312, wherein the second barrier layer 311 is between the second absorber layer 308 and the p-type semiconductor 312. In this example, the first diode detector is a n-b-n detector and the second diode detector is a pb-n detector. The first and second upper contact layers 216, 218 are negatively biased while the first and second ground contact layers 212, 216 are positively biased.

A fourth example of a dual-band imaging device 104' (for example, as shown in FIG. 3) comprises a first absorber layer 304 that is an p-type semiconductor, a first intervening layer 306 that is a first barrier layer, a second absorber layer 308 that is a p-type semiconductor, and a second intervening layer with a second barrier layer 311 and a n-type semiconductor 312, wherein the second barrier layer 311 is between the second absorber layer 308 and the n-type semiconductor 312. In this example, the first diode detector is a p-b-p detector and the second diode detector is a nb-p detector. The first and second upper contact layers 216, 218 are positively biased while the first and second ground contact layers 212, 216 are negatively biased.

Groupings of Pixels in an Array

Figures 4A, 4B:
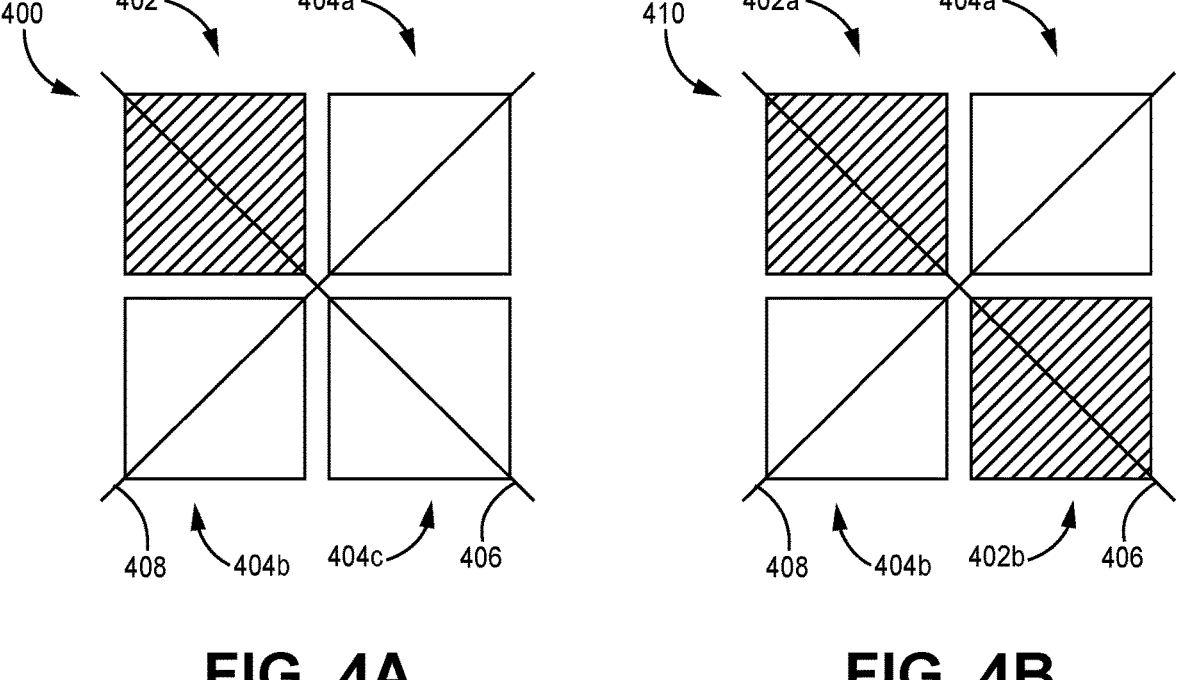
FIG. 4A is a top view of a dual-band imaging device having a first pixel configured to detect light in a first band and a plurality of pixels configured to detect light in a second band according to some embodiments.
FIG. 4B is a top view of a dual-band imaging device having first and second pixels configured to detect light in a first band and third and fourth pixels configured to detect light in a second band according to some embodiments.

FIGS. 4A and 4B are top views illustrating the layout of first pixels 402 and second pixels 404 into groups 400, 410. In some implementations, each group 400, 410 includes at least one first pixel 402 and at least one second pixel 404. At least one first pixel 402 is configured to detect light in a first band of frequencies and at least one second pixel 404 is configured to detect light in a second band of frequencies. In some implementations, the number of first pixels 402 is less than the number of second pixels 404. For example, group 400 shown in FIG. 4A includes one first pixel 402 and three second pixels 404 arranged in a two-by-two grid. In group 400, two sides of the first pixel 402 are adjacent to second pixel 404a, 404b and two sides of the second pixel 404c are adjacent to second pixels 404a, 404b. This layout may also be described as comprising a first pixel 402 and a second pixel 404c arranged in a first diagonal direction 406 and two second pixels 404a, 404b arranged in a second diagonal direction 408 perpendicular to the first diagonal direction 406. The layout illustrated in FIG. 4A may be described as comprising alternating first and second pixels 402, 404 in a first horizontal/vertical direction and only second pixels 404 in a second horizonal/vertical direction parallel to the first horizontal/vertical direction.

In other implementations, the number of first pixels 402 is the same as the number of second pixels 404. For example, group 410 includes two first pixels 402 and two second pixels 404. Two sides of each first pixel 402a, 402b are adjacent to a second pixel 404a, 404b. The layout illustrated in FIG. 4B may be described as comprising first pixels 402 arranged in a first diagonal direction 406 and second pixels 404 arranged in a second diagonal direction 408 perpendicular to the first diagonal direction 406. Alternatively, the layout illustrated in FIG. 4B may be described as having alternating first and second pixels 402, 404 in a first horizontal/vertical direction and in a second horizonal/vertical direction parallel to the first horizontal/vertical direction.

Fabricating a Dual-Band Imaging Device

Figure 5:
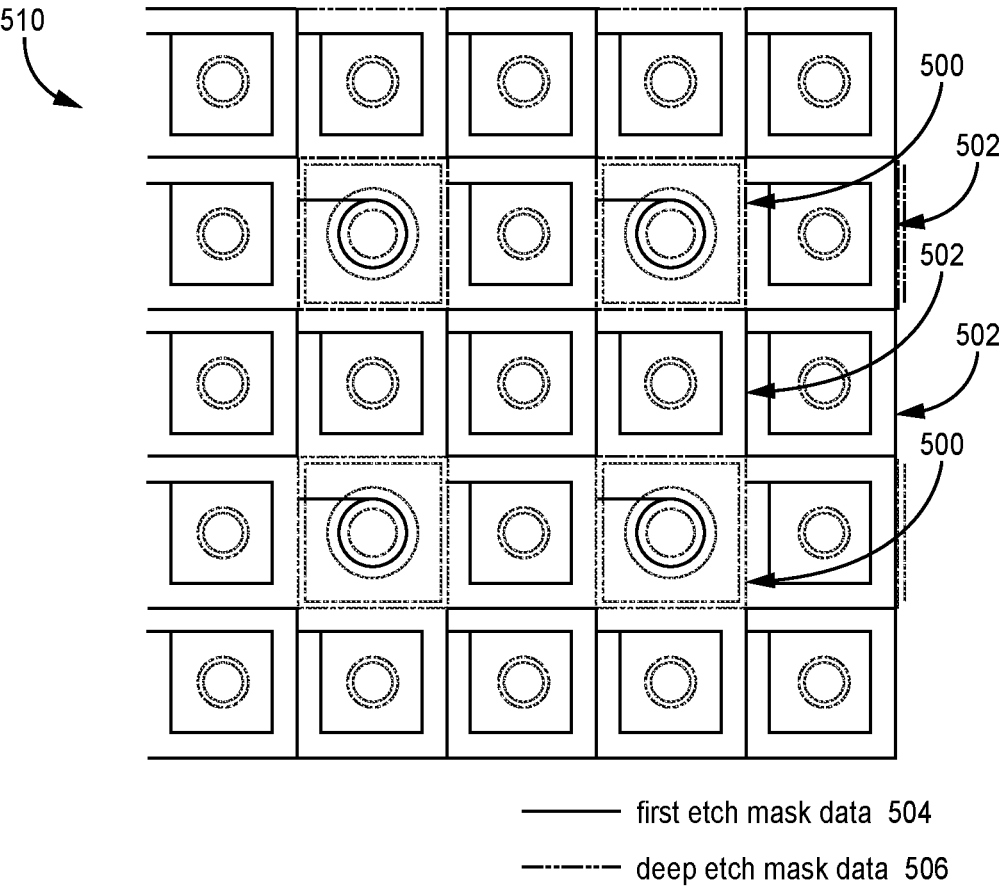
FIG. 5 is a top view of a mask data utilized in etch operations for fabricating the dual-band imaging device with an array of pixels that includes a plurality of first pixels configured to detect light in a first band and a plurality of second pixels configured to detect light in a second band according to some embodiments.

FIG. 5 is a top view of a mask data 510 utilized in etch operations for fabricating the dual-band imaging device 104 with an array of pixels that includes a plurality of first pixels 500 configured to detect light 110 in a first band and a plurality of second pixels 502 configured to detect light 112 in a second band according to some embodiments. In this example, the layout of the pixels is similar to that shown in FIG. 4A, in which each grid of four pixels includes three second pixels 502 and one first pixel 500. Stated another way, each first pixel 500 is adjacent to/surrounded by eight second pixels 502.

As discussed above, a shallow etch 504 may be used to fabricate the first mesa 220a, 322a shown in FIGS. 2 and 3 associated with fabrication of the second pixels 502 (e.g., second pixels 202, 302 shown in FIGS. 2 and 3) and a deep etch 506 may be used to fabricate the deep etch 222, 324 associated with fabrication of the first pixels 500 (e.g., first pixels 200, 300 shown in FIGS. 2 and 3). FIG. 5 illustrates the mask data 510 utilized for the first mesa etch 220a, 322a, represented by solid black lines and the mask data utilized for the deep etch 222, 324, represented by dashed black lines. As shown, the deep etch mask data is utilized to create the deep etch 222, 324 that surrounds the first pixel 500. FIG. 5 does not illustrate mask data associated with the fabrication of a base for a ground contact layer for the first pixels 500 (e.g., first ground contact layer 212, 314 shown in FIGS. 2 and 3). Additionally, FIG. 5 does not illustrate mask data associated with the fabrication of a base for a ground contact layer for the second pixels 502 (e.g., second mesa 220b, 322b, associated with the second ground contact layer 214, 316). In some embodiments, the second ground contact layer 214, 316 is continuous all the way to the periphery of the array of pixels.

In this way, the present invention provides a dual-band system capable of simultaneously detecting light in a first band and a second band. In addition, the dual-band imaging device may be utilized in conjunction with a single polarity read-out integrated circuit.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A dual-band imaging device comprising:
a plurality of pixels, wherein each of the plurality of pixels comprises:
  a first absorber layer;
  a first intervening layer located adjacent the first absorber layer;
  a second absorber layer located adjacent to the first intervening layer; and
  a second intervening layer located adjacent to the second absorber layer;
wherein the plurality of pixels includes a first subset of pixels for detecting light in a first band and a second subset of pixels for detecting light in a second band,
the first subset of pixels comprising:
  a first ground plane contact in contact with the first absorber layer; and
  a first contact layer in contact with the second absorber layer,
  wherein carriers created in the first absorber layer are collected via the first contact layer;

the second subset of pixels comprising:
  a second ground plane contact in contact with the second absorber layer; and
  a second contact layer in contact with the second intervening layer,
  wherein carriers created in the second absorber layer are collected via the second contact layer and
  wherein carriers created in the first absorber layer remain uncollected.

2. The dual-band imaging device of claim 1, wherein:
the first absorber layer is an n-type semiconductor,
the first intervening layer is a p-type semiconductor,
the second absorber layer is an n-type semiconductor, and
the second intervening layer is a p-type semiconductor,
wherein the first subset of pixels includes an n-p-n detector that includes the first absorber layer, the first intervening layer, and the second absorber layer, and
wherein the second subset of pixels includes p-n detector that includes the second absorber layer and the second intervening layer.

3. The dual-band imaging device of claim 1, wherein:
the first absorber layer is a p-type semiconductor,
the first intervening layer is an n-type semiconductor,
the second absorber layer is a p-type semiconductor, and
the second intervening layer is an n-type semiconductor,
wherein the first subset of pixels includes an p-n-p detector that includes the first absorber layer, the first intervening layer, and the second absorber layer, and
wherein the second subset of pixels includes n-p detector that includes the second absorber layer and the second intervening layer.

4. The dual-band imaging device of claim 1, wherein:
the first absorber layer is an n-type semiconductor,
the first intervening layer is a barrier layer,
the second absorber layer is an n-type semiconductor, and
the second intervening layer comprises a barrier layer and a p-type semiconductor layer formed adjacent to the barrier layer,
wherein the first subset of pixels includes an n-b-n detector that includes the first absorber layer, the first intervening layer, and the second absorber layer, and
wherein the second subset of pixels includes pb-n detector that includes the second absorber layer and the second intervening layer.

5. The dual-band imaging device of claim 1, wherein:
the first absorber layer is a p-type semiconductor,
the first intervening layer is a barrier layer,
the second absorber layer is a p-type semiconductor, and
the second intervening layer comprises a barrier layer and an n-type semiconductor layer,
wherein the first subset of pixels includes an p-b-p detector that includes the first absorber layer, the first intervening layer, and the second absorber layer, and
wherein the second subset of pixels includes an nb-p detector that includes the second absorber layer and the second intervening layer.

6. The dual-band imaging device of claim 1, wherein a deep mesa etch separates the first subset of pixels from the second subset of pixels, wherein the deep mesa etch extends through the second intervening layer, the second absorber layer, the first intervening layer, and at least partially through the first absorber layer.

7. A dual-band imaging device comprising:
a first pixel comprised of:
  a first absorber layer,
  a second absorber layer, a first intervening layer located between the first and second absorber layers, a second intervening layer located on top of the second absorber layer, a first ground contact in electrical contact with the first absorber layer, and a first upper contact in electrical contact with the second absorber layer, wherein the first pixel collects carriers created in the first absorber layer using a first diode detector comprising the first absorber layer, the first intervening layer, and the second absorber layer; and a second pixel comprised of:

the first absorber layer, the second absorber layer, the first intervening layer located between the first and second absorber layers, the second intervening layer located on top of the second absorber layer, a second ground contact in electrical contact with the second absorber layer, and a second upper contact in electrical contact with the second intervening layer, wherein the second pixel collects carriers created in the second absorber layer using a second diode detector comprising the second absorber layer and the second intervening layer.

8. The dual-band imaging device of claim 7, wherein a first trench is formed around the first pixel, wherein the first trench extends through the first and second intervening layers, the second absorber layer, and at least a portion of the first absorber layer.

9. The dual-band imaging device of claim 8, wherein a second trench is formed around the second pixel, wherein the second trench extends through the second intervening layer and at least a portion of the second absorber layer.

10. The dual-band imaging device of claim 7, wherein the dual-band image device includes a first plurality of first pixels and a second plurality of second pixels.

11. The dual-band imaging device of claim 10, wherein the second plurality of pixels are greater in number than the first plurality of pixels.

12. The dual-band imaging device of claim 7, wherein the first diode detector is a N-P-N detector, wherein the first absorber layer is an n-type semiconductor layer, the first intervening layer is a p-type semiconductor layer, and the second absorber layer is an n-type semiconductor layer.

13. The dual-band imaging device of claim 12, wherein the second diode detector is a P-N detector, wherein the second intervening layer is a p-type semiconductor layer.

14. The dual-band imaging device of claim 7, wherein the first diode detector is a P-N-P detector, wherein the first absorber layer is an p-type semiconductor layer, the first intervening layer is an n-type semiconductor layer, and the second absorber layer is a p-type semiconductor layer.

15. The dual-band imaging device of claim 14, wherein the second diode detector is a N-P detector, wherein the second intervening layer is an n-type semiconductor layer.

16. The dual-band imaging device of claim 7, wherein the first diode detector is a N-B-N detector, wherein the first absorber layer is an n-type semiconductor layer, the first intervening layer is a barrier layer, and the second absorber layer is an n-type semiconductor layer.

17. The dual-band imaging device of claim 16, wherein the second diode detector is an PB-N detector, wherein the second intervening layer includes a barrier layer and a p-type semiconductor layer stacked on top of the barrier layer.

18. The dual-band imaging device of claim 7, wherein the first diode detector is a P-B-P detector, wherein the first absorber layer is an p-type semiconductor layer, the first intervening layer is a barrier layer, and the second absorber layer is an p-type semiconductor layer.

19. The dual-band imaging device of claim 18, wherein the second diode detector is a NB-P detector, wherein the second intervening layer includes a barrier layer and a n-type semiconductor layer stacked on top of the barrier layer.

20. The dual-band imaging device of claim 7, further including:

a read-out integrated circuit (ROIC) comprising a plurality of electrical bumps, each bump in contact with one of the first upper contacts or second upper contacts, wherein the ROIC is a single polarity device that provides a single bias voltage to each of the plurality of electrical bumps.

* * * * *